United States Patent [19]

Sakaida

[11] 4,147,986

[45] Apr. 3, 1979

[54] AM-FM RECEIVER

[75] Inventor: Kaku Sakaida, Tokyo, Japan

[73] Assignee: Trio Kabushiki Kaisha, Tokyo, Japan

[21] Appl. No.: 751,702

[22] Filed: Dec. 17, 1976

[30] Foreign Application Priority Data

Dec. 19, 1975 [JP] Japan .......................... 50-172070[U]

[51] Int. Cl.² .............................................. H04B 1/16
[52] U.S. Cl. ................................... 325/316; 325/458; 329/1
[58] Field of Search ............... 325/302, 315, 316, 313, 325/21, 458; 329/1, 2, 147

[56] References Cited

U.S. PATENT DOCUMENTS

| 3,875,514 | 4/1975 | Klein | 325/316 |
| 4,050,022 | 9/1977 | McFadyen | 325/315 |
| 4,070,628 | 1/1978 | Funabashi | 325/316 |

Primary Examiner—John C. Martin
Assistant Examiner—Marc E. Bookbinder
Attorney, Agent, or Firm—Lane, Aitken & Ziems

[57] ABSTRACT

An AM-FM receiver has switching elements such as field effect transistors inserted in a signal path of the FM circuit. A switch for applying bias voltage to the AM or FM front end circuit is arranged to operate synchronously with switching of the bias voltage to the switching elements. A time constant circuit comprising a series-connected resistor and a capacitor is inserted between the switch and the switching elements to delay application of the bias voltage to the switching elements only when the switch is thrown to bias the switching elements in order to suppress shock noises during AM-FM switching operation.

2 Claims, 4 Drawing Figures

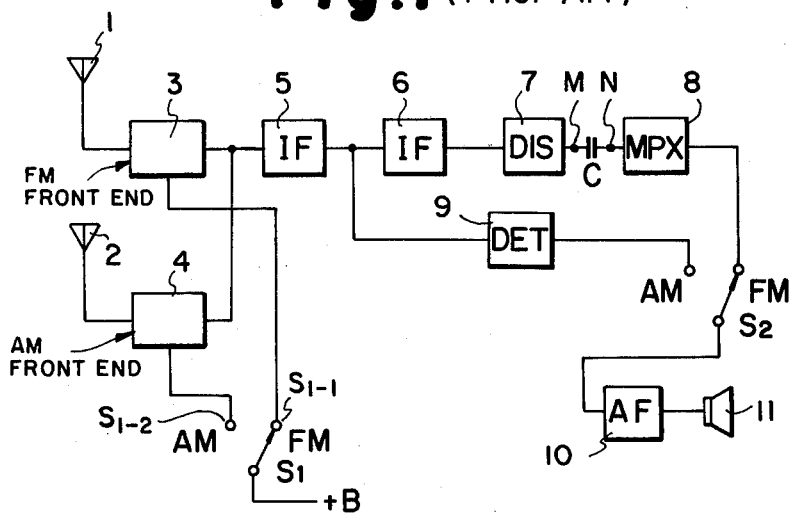
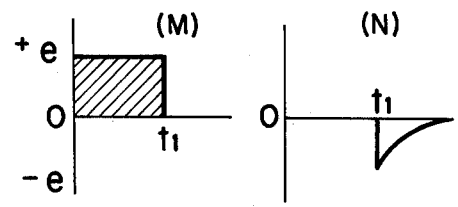
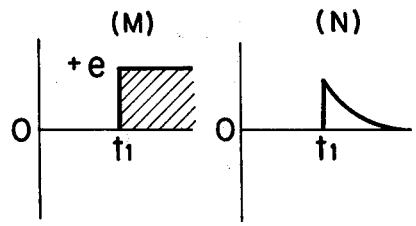

AM-FM RECEIVER

BACKGROUND OF THE INVENTION

1. Field of the Invention

The present invention relates to an AM-FM receiver having means for preventing shock noises that are generated during switching between AM and FM modes.

2. Prior Art

In the conventional AM-FM receiver shown in FIG. 1, the high frequency stages (the FM and AM front end circuit 3 and 4) and subsequent stages have a B+ bias voltage applied thereto at all times. Switching between AM and FM modes is accomplished by throwing a switch $S_1$ for applying the B+ voltage in synchronism with a switch $S_2$ which shifts between the AM and FM audio outputs. When the throwing operations of switches $S_1$ and $S_2$ are out of synchronism, shock noises are generated.

More specifically, if the switch $S_2$ is thrown after the switch $S_1$ when the receiver is switched from FM to AM, a positive or negative DC voltage is produced in a discriminator 7 if the receiver is out of tune with an FM station. At this time, since the B+ voltage applied to the FM front end circuit 3 is cancelled and the DC voltage is also eliminated, a shock noise is generated as shown in FIG. 2A. On the other hand, if the switch $S_2$ is thrown before the switch $S_1$ when the receiver is to switch from AM to FM, the B+ voltage is suddenly applied to the FM front end circuit 3, with the receiver out of tune, and a positive or negative DC voltage is generated in the discriminator 7. A shock noise is then produced as shown in FIG. 2B.

SUMMARY OF THE INVENTION

It is an object of the present invention to provide an AM-FM receiver in which shock noises can be eliminated even when a switch for shifting the B+ voltage between AM and FM front end circuits is thrown out of synchronism with a switch for switching between the AM and FM audio outputs.

According to the invention, a time constant circuit consisting of a resistor and a capacitor is connected in series between switching elements such as field effect transistors and a switch for switching the bias between the AM and FM front end circuits. The bias to the field effect transistors is switched synchronously with respect to the operation of the switch. When the switch is thrown from the FM front end circuit to the AM front end circuit, application of the bias to the field effect transistors is delayed by the time constant circuit to eliminate shock noises during AM-FM switching.

BRIEF DESCRIPTION OF THE DRAWINGS

FIG. 1. is a block diagram of a conventional AM-FM receiver;

FIGS. 2A and 2B are graphs showing the shock noise waveforms generated at points M and N in FIG. 1 when switching between AM and FM is made.

DESCRIPTION OF THE PREFERRED EMBODIMENT

Figure 3:
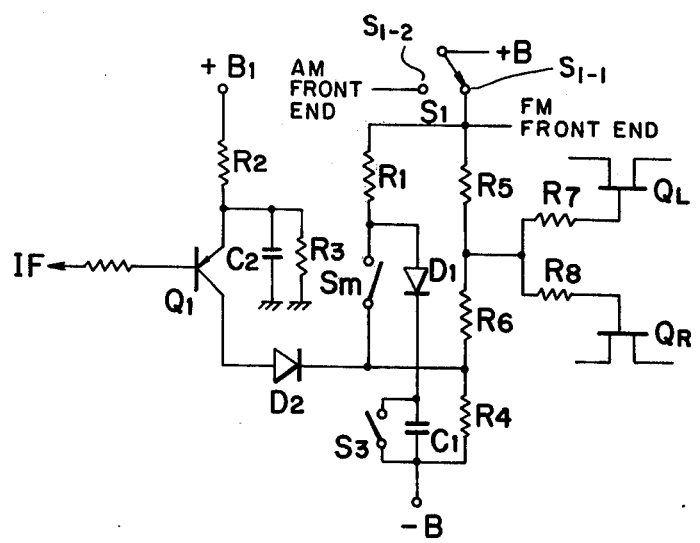
FIG. 3 is a diagram of a circuit constructed according to the invention.

Referring to FIG. 3 in which a muting circuit is utilized, a transistor $Q_1$ has its emitter connected between resistors $R_2$ and $R_3$ which serve as a voltage divider, the emitter being applied a B+ voltage. The on-off of the transistor $Q_1$ is controlled by an IF signal from the intermediate frequency stage 6. The collector of the transistor $Q_1$ is connected through a diode $D_2$ and a resistor $R_4$ to a B− voltage supply. A capacitor $C_2$ is connected between the emitter of the transistor $Q_1$ and the earth. Designated at $S_1$ is a switch for shifting the bias between the AM and FM front end circuits 3 and 4 as described with reference to FIG. 1. When thrown to the FM terminal $S_{1-1}$, the switch $S_1$ also supplies the bias voltage to the switching elements, field effect transistors (FET) $Q_L$ and $Q_R$ which are inserted in a signal path of the FM circuit. A muting switch $S_m$ is provided between the diode $D_2$ and the resistor $R_1$. Between the B− voltage supply and a contact of the switch $S_m$ that leads to the $S_{1-1}$ terminal of the switch $S_1$, there are connected a diode $D_1$ and a capacitor $C_1$ in series with each other. The time constant circuit comprises the resistor $R_1$, the capacitor $C_1$ and diode $D_1$. The switch $S_m$, when closed turns off the time constant circuit, and when opened, turns on the time constant circuit. Connected across the capacitor $C_1$ is a switch $S_3$ the function of which will be later described.

The operation of the circuit described above will now be explained. Assuming that the receiver is out of tune and a DC voltage is generated in the discriminator 7 when the switch $S_1$ is thrown to the AM side or $S_{1-2}$ terminal, the bias to the FETs $Q_L$ and $Q_R$ will be cut off, thereby de-energizing the FETs $Q_L$ and $Q_R$. The DC output is thus cut off to thereby prevent generation of shock noise. Conversely, when the switch $S_1$ is thrown to the FM side or terminal $S_{1-1}$, the capacitor $C_1$ is then charged through the diode $D_1$ to delay application of the bias voltage to the FETs $Q_L$ and $Q_R$ whereupon the noise can be prevented from being generated.

At this time, the diode $D_1$ serves to prevent the charged capacitor $C_1$ from being discharged via the resistor $R_1$ when the switch $S_1$ is thrown to the AM side. The diode $D_1$ is required because discharge of the capacitor $C_1$ through the resistor $R_1$ may not provide the pinch-off voltage for the FETs $Q_L$ and $Q_R$ upon shifting of the switch $S_1$ to the AM side.

The switch $S_3$ is provided to discharge the charged capacitor $C_1$ when the receiver is receiving the other than FM broadcasting. The capacitor $C_1$, however, can be discharged in time without provision of the switch $S_3$ during reception of the AM broadcasting. The switch $S_3$ provides for the situation which the switch $S_1$ is thrown from AM to FM to Am again to FM in a short period of time, and its provision may not be necessary in reality. The switch $S_3$, if provided, should be changed with the switch $S_1$ in such a manner that if the switch $S_1$ is thrown to the AM side, then the switch $S_3$ is closed, and vice versa.

The operation of the switches $S_1$ and $S_3$ is not related to the opening and closing operation of the switch $S_m$. When the muting circuit is "on", the series circuit consisting of the diode $D_1$ and the capacitor $C_1$ is separated and there is no adverse influence on rise-up of the signal during a muting interval. Also during the muting operation, the transistor $Q_1$ detects the signal from the intermediate-frequency amplifier 6 very sharply. When a DC voltage is produced in the discriminator 7, $Q_1$ is turned off and shock noises during AM-FM switching operation can thus be prevented.

With the circuit structure according to the invention, shock noises due to a DC voltage from the discriminator 7 can be suppressed completely where the switches $S_1$ and $S_2$ that are arranged to operate out of synchronism are used for AM-FM switching, or when the switches S₁ and S₂ are thrown out of synchronism actually. The muting circuit thus constructed is less costly and more beneficial from the standpoint of special utilization and presents no obstruction to muting operation.

I claim as my invention:

1. In an AM-FM receiver having AM and FM receiving circuits, said AM receiving circuits including an AM front end circuit, an intermediate frequency stage, and a detector; said FM receiving circuits including an FM front end circuit, intermediate frequency stages and a discriminator; said AM and FM receiving circuits further including an audio amplifier, a first switch for applying operating power selectively to one of said AM and FM front end circuits, and a second switch for selectively connecting the outputs of either said detector or said discriminator to said audio amplifier, the improvement comprising:

- at least one switching element inserted in a signal path of the FM receiving circuits after said discriminator;
- means for applying a bias voltage to said at least one switching element when said first switch is switched to apply said bias voltage to said FM front end circuit; and
- a time constant circuit comprising a series connected resistor, capacitor and diode inserted between said first switch and said at least one switching element in order to delay the application of the bias voltage to said at least one switching element.

2. The improvement as defined in claim 1 wherein said at least one switching element is a field effect transistor having first, second and third electrodes, said first electrode connected to said means for applying the bias voltage and said second and third electrodes connected in said signal path.

* * * * *